US012088047B2

(12) United States Patent
Maeda

(10) Patent No.: US 12,088,047 B2
(45) Date of Patent: Sep. 10, 2024

(54) CONNECTOR MEMBER AND CONNECTOR SET

(71) Applicant: Murata Manufacturing Co., Ltd., Kyoto-fu (JP)

(72) Inventor: Yoshiro Maeda, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 589 days.

(21) Appl. No.: 17/359,043

(22) Filed: Jun. 25, 2021

(65) Prior Publication Data

US 2021/0328385 A1    Oct. 21, 2021

Related U.S. Application Data

(63) Continuation of application No. PCT/JP2019/049526, filed on Dec. 18, 2019.

(30) Foreign Application Priority Data

Dec. 27, 2018   (JP) .................................. 2018-244489

(51) Int. Cl.
*H01R 13/6471* (2011.01)
*H01R 12/71* (2011.01)

(52) U.S. Cl.
CPC ......... *H01R 13/6471* (2013.01); *H01R 12/71* (2013.01)

(58) Field of Classification Search
CPC ............. H01R 13/646; H01R 13/6461; H01R 13/6471; H01R 12/70; H01R 12/71; H01R 12/712714; H01R 12/716
USPC ....................................................... 439/78
See application file for complete search history.

(56) References Cited

U.S. PATENT DOCUMENTS

2003/0051902 A1   3/2003  Aoki
2007/0155229 A1   7/2007  Wu
2021/0320441 A1*  10/2021 Maeda ................. H01R 12/716
(Continued)

FOREIGN PATENT DOCUMENTS

CN        104040787 A    9/2014
JP       2003-092468 A    3/2003
JP       2010-027354 A    2/2010
(Continued)

OTHER PUBLICATIONS

International Search Report issued in PCT/JP2019/049526, mailed Feb. 10, 2020.
(Continued)

*Primary Examiner* — Khiem M Nguyen
(74) *Attorney, Agent, or Firm* — Studebaker & Brackett PC

(57) ABSTRACT

A connector member includes a connector and a substrate. The connector includes an insulating member, and internal terminals held by the insulating member. The substrate includes an insulating base material, substrate-side terminal conductors formed on a main surface of the base material, and a ground conductor connected to ground potential. The internal terminals are mounted on the substrate-side terminal conductors, respectively. At least two of the substrate-side terminal conductors on which the internal terminals not used for transmitting signals including a high-frequency signal are mounted are connected to the ground conductor at multiple locations.

20 Claims, 6 Drawing Sheets

(56) References Cited

U.S. PATENT DOCUMENTS

2021/0328385 A1* 10/2021 Maeda ................. H01R 12/716
2021/0391661 A1* 12/2021 Maeda ................... H01R 12/73

FOREIGN PATENT DOCUMENTS

| JP | 2015-507358 A | 3/2015 |
| JP | 2015-230840 A | 12/2015 |
| JP | 2016-129148 A | 7/2016 |

OTHER PUBLICATIONS

International Preliminary Report On Patentability and Written Opinion PCT/JP2019/049526, mailed Jun. 16, 2021.

* cited by examiner

CONNECTOR MEMBER AND CONNECTOR SET

CROSS-REFERENCE TO RELATED APPLICATIONS

This application claims benefit of priority to International Patent Application No. PCT/JP2019/0049526, filed Dec. 18, 2019, and to Japanese Patent Application No. 2018-244489, filed Dec. 27, 2018, the entire contents of each are incorporated herein by reference.

BACKGROUND

Technical Field

The present disclosure relates to a connector member constituted by a connector in which a plurality of connection terminals is arranged and a substrate on which the connector is mounted.

Background Art

Japanese Unexamined Patent Application Publication No. 2015-230840 describes a connector including a plurality of connection terminals. The connector described in Japanese Unexamined Patent Application Publication No. 2015-230840 has a resin base. The connection terminals are made of conductors, respectively, and are arranged at intervals along one direction of the base.

The connection terminals are used as, for example, terminals for connection to a ground, or terminals for transmitting various signals, or the like.

SUMMARY

However, when the connection terminal is used as a terminal for transmitting a high-frequency signal, the high-frequency signal may be radiated from the connection terminal. A problem arises in which the radiated high-frequency signal propagates to another connection terminal or the like and resonates to generate a radiation noise. Such a radiation noise adversely affects transmission characteristics of signals such as a high-frequency signal.

Thus, the present disclosure provides a connector member capable of suppressing deterioration of transmission characteristics due to a radiation noise caused by a high-frequency signal in a configuration having a terminal for transmitting a high-frequency signal.

A connector member of the present disclosure includes a connector and a substrate. The connector includes an insulating member and a plurality of connection terminals arranged on and held by the insulating member. The substrate includes an insulating base material, a plurality of substrate-side terminal conductors formed on a surface of the base material, and a first ground conductor connected to ground potential.

The plurality of connection terminals is mounted on the plurality of substrate-side terminal conductors. At least two of the substrate-side terminal conductors on which, among the connection terminals, connection terminals not used for transmitting signals including a high-frequency signal are mounted are connected to the first ground conductor at multiple locations.

In this configuration, the substrate-side terminal conductor on which the connection terminal not used for transmitting signals including a high-frequency signal is mounted is connected to the first ground conductor at the multiple locations, thereby reducing a radiation noise due to the high-frequency signal.

According to the present disclosure, it is possible to suppress deterioration of transmission characteristics due to a radiation noise caused by a high-frequency signal in the configuration having a terminal for transmitting a high-frequency signal.

DETAILED DESCRIPTION

First Embodiment

Figure 1A:
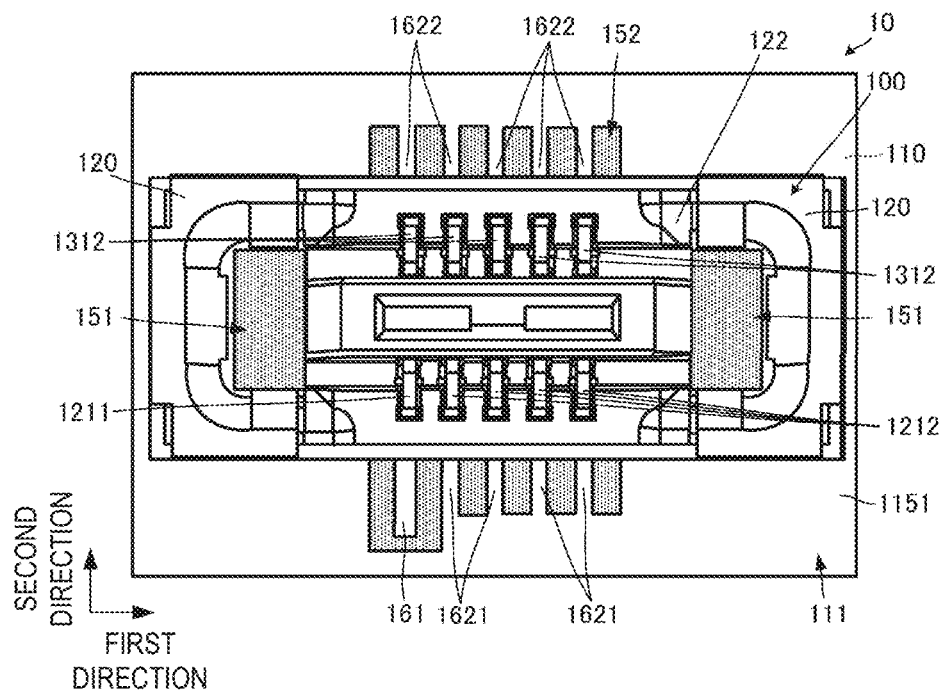
FIG. 1A is a plan view of a connector member according to a first embodiment.
Figure 1B:
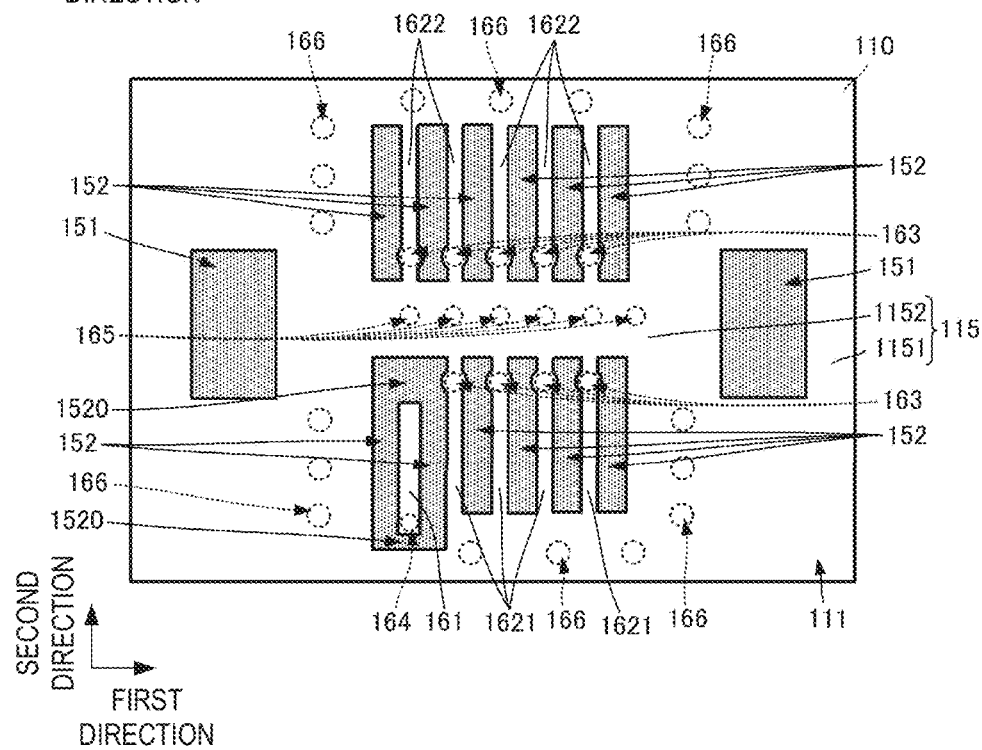
FIG. 1B is a plan view of a substrate according to the first embodiment.
Figure 2:
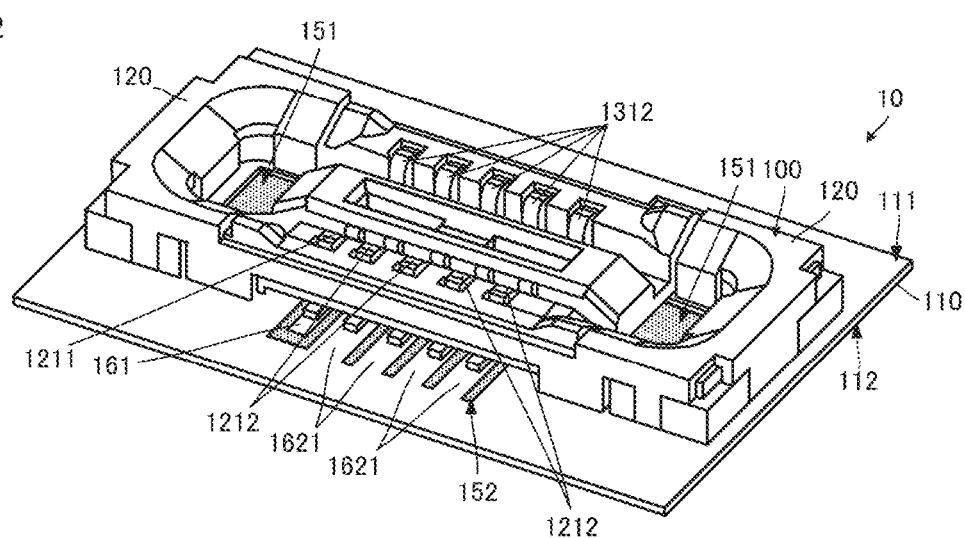
FIG. 2 is a perspective view of the connector member according to the first embodiment.
Figure 3A:
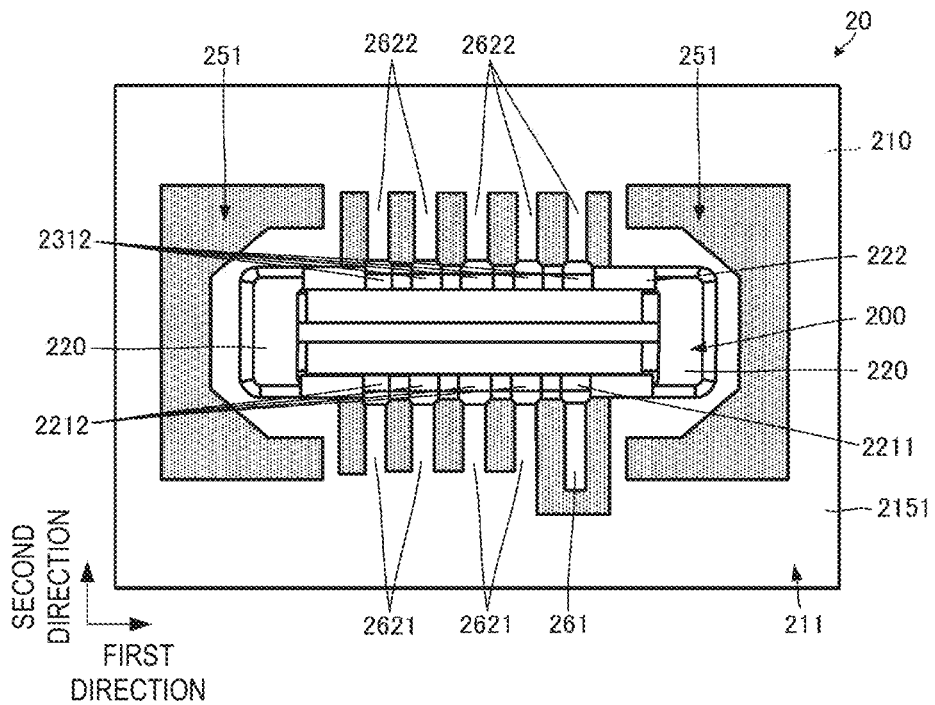
FIG. 3A is a plan view of a connector member according to a second embodiment.
Figure 3B:
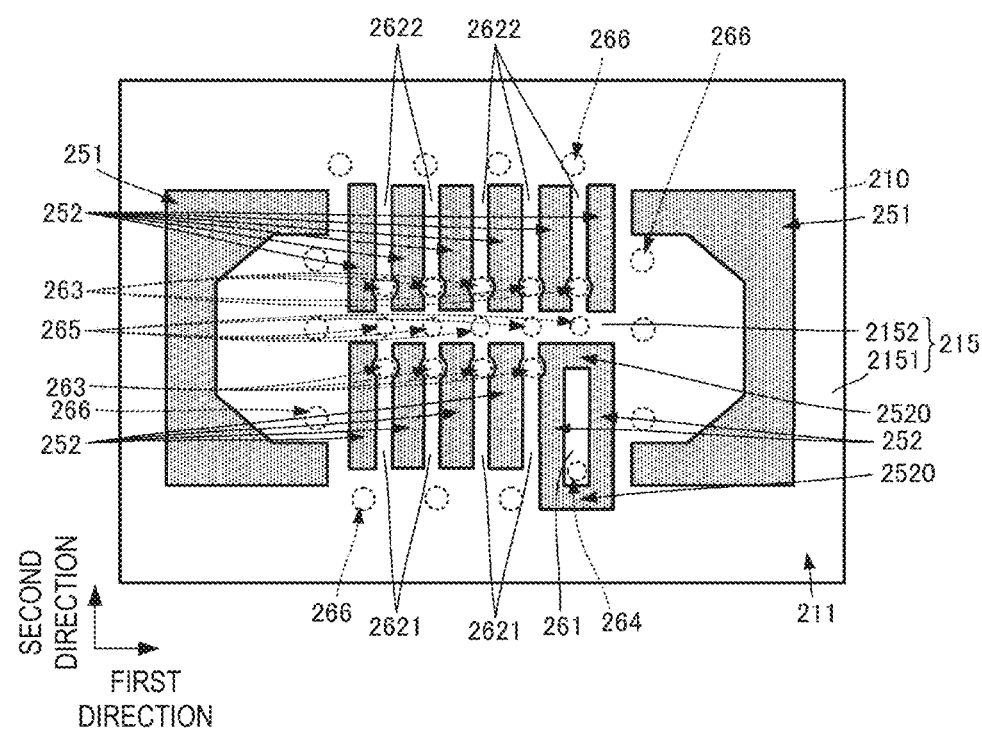
FIG. 3B is a plan view of a substrate according to the second embodiment.
Figure 4:
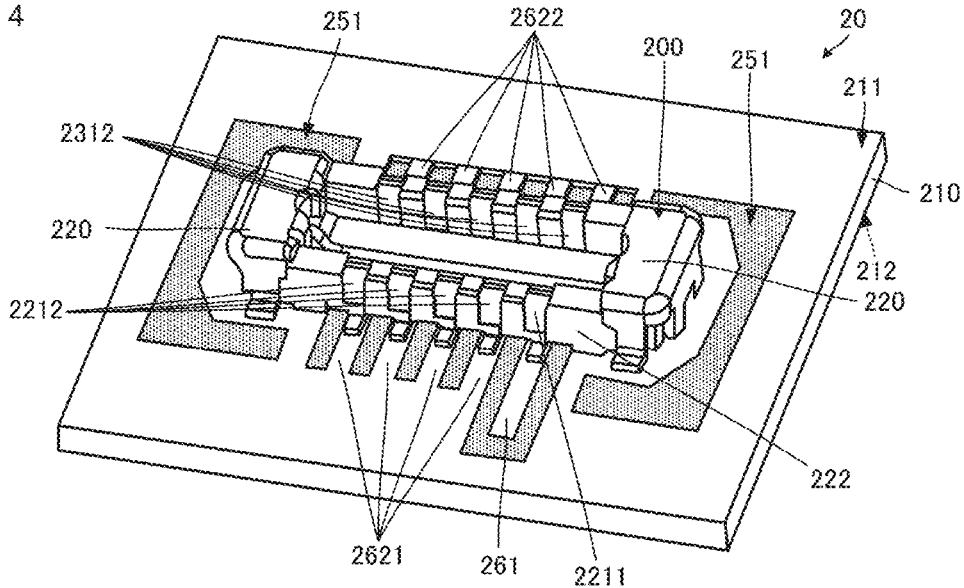
FIG. 4 is a perspective view of the connector member according to the first embodiment.

A connector member and a connector set according to a first embodiment of the present disclosure will be described with reference to the accompanying drawings. FIG. 1A is a plan view of the connector member 10 according to the first embodiment, and FIG. 1B is a plan view of the substrate 110 according to the first embodiment. FIG. 2 is a perspective view of the connector member 10 according to the first embodiment. FIG. 3A is a plan view of the connector member 20 according to a second embodiment, and FIG. 3B is a plan view of the substrate 210 according to the second embodiment. FIG. 4 is a perspective view of the connector member 20 according to the first embodiment. Note that, in each of the drawings in the following embodiments, a longitudinal and lateral dimensional relationship is appropriately emphasized and described, and does not necessarily coincide with a longitudinal and lateral dimensional relationship in actual dimensions. In addition, in order to make the drawings easy to see, some reference numerals are omitted as necessary.

(Schematic Configuration of Connector Set)

As illustrated in FIG. 1A, FIG. 1B, and FIG. 2, the connector member 10 includes a connector 100 and the substrate 110. The connector 100 is mounted on the substrate 110. The connector 100 includes an internal terminal 1211, an internal terminal 1212, and an internal terminal 1312. The connector member 10 corresponds to, for example, a "first connector member" of the present disclosure.

As illustrated in FIG. 3A, FIG. 3B, and FIG. 4, the connector member 20 includes a connector 200 and a substrate 210. The connector 200 is mounted on the substrate 210. The connector 200 includes an internal terminal 2211, an internal terminal 2212, and an internal terminal 2312. The connector member 20 corresponds to, for example, a "second connector member" of the present disclosure.

Although not illustrated, a connector set is constituted by the connector 100 and the connector 200 fitted to each other. At this time, the internal terminal 1211 is connected to the internal terminal 2211, the internal terminal 1212 is connected to the internal terminal 2211, and the internal terminal 1312 is connected to the internal terminal 2312. Thus, the connector member 10 and the connector member 20 are connected to each other so as to form a plurality of signal transmission paths.

(Structure of Connector Member 10)

As illustrated in FIG. 1A, FIG. 1B, and FIG. 2, the connector member 10 includes the connector 100 and the substrate 110. The connector 100 is mounted on the substrate 110.

(Structure of Substrate 110)

The substrate 110 includes an insulating base material, and has a main surface 111 and a main surface 112 opposite from each other. The main surface 111 corresponds to "a surface of a base material" of the present disclosure. A ground conductor 115, a substrate-side terminal conductor 161, a plurality of substrate-side terminal conductors 1621, and a plurality of substrate-side terminal conductors 1622 are formed on the main surface 111 of the substrate 110. The substrate-side terminal conductor 161, the plurality of substrate-side terminal conductors 1621, and the plurality of substrate-side terminal conductors 1622 are strip-shaped conductor patterns extending along a second direction of the substrate 110.

The substrate-side terminal conductor 161 and the substrate-side terminal conductors 1621 are arranged at intervals along a first direction of the substrate 110. The substrate-side terminal conductor 161 is arranged at one end of the arrangement.

The substrate-side terminal conductors 1622 are arranged at intervals along the first direction of the substrate 110. A row of the plurality of substrate-side terminal conductors 1622 is parallel to a row of the substrate-side terminal conductor 161 and the plurality of substrate-side terminal conductors 1621, and these rows are arranged at intervals in the second direction. That is, the substrate-side terminal conductors including the substrate-side terminal conductor 161, the substrate-side terminal conductors 1621, and the substrate-side terminal conductors 1622 are arranged in the multiple rows. Further, the number of the substrate-side terminal conductors 1622 is the same as the number of the substrate-side terminal conductors 161 and the substrate-side terminal conductors 1621, and in the first direction, one substrate-side terminal conductor 1622 is at the same position as the substrate-side terminal conductor 161, and the other substrate-side terminal conductors 1622 are at the same positions as the substrate-side terminal conductors 1621, respectively.

A slit 152 having a substantially rectangular shape in plan view is formed between the substrate-side terminal conductor 161 and the substrate-side terminal conductor 1621 adjacent thereto, and between the substrate-side terminal conductors 1621 adjacent to each other in the plurality of substrate-side terminal conductors 1621. Additionally, slits 152 are also formed on both sides of the row including the substrate-side terminal conductors 161 and the substrate-side terminal conductors 1621, respectively.

The plurality of slits 152 is realized by a portion of the main surface 111 of the substrate 110 where no conductor is formed.

Further, slits 1520 are also formed on both sides of the substrate-side terminal conductor 161 in the second direction, and the substrate-side terminal conductor 161 is surrounded by the slits 152 on both the sides in the first direction and the slits 1520 on both the sides in the second direction. The plurality of slits 1520 is realized by a portion of the main surface 111 of the substrate 110 where no conductor is formed. Thus, the substrate-side terminal conductor 161 is separated from the other conductor patterns on the main surface 111 of the substrate 110.

The slit 152 having the substantially rectangular shape in plan view is formed between the substrate-side terminal conductors 1622 adjacent to each other in the plurality of substrate-side terminal conductors 1622. Additionally, the slits 152 are also formed on both sides of the row including the plurality of substrate-side terminal conductors 1622.

The ground conductor 115 is a conductor pattern connected to the ground potential. The ground conductor 115 is constituted by a ground conductor 1151 and a ground conductor 1152. The ground conductor 115 corresponds to the "first ground conductor" of the present disclosure, the ground conductor 1151 corresponds to a "second ground conductor" of the present disclosure, and the ground conductor 1152 corresponds to a "third ground conductor" of the present disclosure.

The ground conductor 1151 is formed over substantially an entire region of the main surface 111 between all side ends of the substrate 110 and a region where the substrate-side terminal conductor 161, the plurality of substrate-side terminal conductors 1621, and the plurality of substrate-side terminal conductors 1622 are formed. The ground conductor 1152 is formed between a region where the substrate-side terminal conductor 161 and the plurality of substrate-side terminal conductors 1621 are formed and a region where the plurality of substrate-side terminal conductors 1622 is formed. The ground conductor 1152 is connected to the ground conductor 1151.

A plurality of slits 151 is formed in the ground conductor 1151. The slits 151 are each substantially rectangular in plan view, and are respectively formed near both ends, in the first direction, of the region in which the substrate-side terminal conductor 161, the plurality of substrate-side terminal conductors 1621, and the plurality of substrate-side terminal conductors 1622 are formed. Further, the plurality of slits 151 is formed so as to include the region between the row of the substrate-side terminal conductors 161 and the plurality of substrate-side terminal conductors 1621 and the row of the plurality of substrate-side terminal conductors 1622 in the second direction.

One end of each of the substrate-side terminal conductors 1621 and the substrate-side terminal conductors 1622 is connected to the ground conductor 1151, and another end thereof is connected to the ground conductor 1152. That is, all of the plurality of substrate-side terminal conductors 1621 and the plurality of substrate-side terminal conductors 1622 are connected to the ground conductor 1151 and the ground conductor 1152, in other words, all of the plurality of substrate-side terminal conductors 1621 and the plurality of substrate-side terminal conductors 1622 are connected to the ground conductor 115 at multiple locations.

On the main surface 112 and in another layer of the substrate 110, although not illustrated, a ground conductor is formed. That is, a ground conductor (corresponding to a "fourth ground conductor" of the present disclosure) is formed at a position different from that of the ground conductor 115 in a thickness direction of the substrate 110.

The substrate 110 includes a plurality of interlayer connection conductors 163, an interlayer connection conductor 164, a plurality of interlayer connection conductors 165, and a plurality of interlayer connection conductors 166. The plurality of interlayer connection conductors 163, the plurality of interlayer connection conductors 165, and the plurality of interlayer connection conductors 166 correspond to "ground interlayer connection conductors" of the present disclosure. The interlayer connection conductor 164 overlaps the substrate-side terminal conductor 161 in plan view. The interlayer connection conductor 164 is connected to the substrate-side terminal conductor 161, and is connected to a wiring conductor (not illustrated) in the other layer of the substrate 110. The interlayer connection conductors 163, in plan view, overlap the substrate-side terminal conductors 1621 and the substrate-side terminal conductors 1622, respectively. The plurality of interlayer connection conductors 163 connects the plurality of substrate-side terminal conductors 1621 and the plurality of substrate-side terminal conductors 1622 to a ground conductor of the main surface 112, or a ground conductor in a layer other than the main surface 111 of the substrate 110. The plurality of interlayer connection conductors 165 overlaps the ground conductor 1152 in plan view. The plurality of interlayer connection conductors 165 connects the ground conductor 1152 to the ground conductor of the main surface 112, or the ground conductor in the layer other than the main surface 111 of the substrate 110. The plurality of interlayer connection conductors 166 overlaps the ground conductor 1151 in plan view. The plurality of interlayer connection conductors 166 connects the ground conductor 1151 to the ground conductor of the main surface 112 or the ground conductor in the layer other than the main surface 111 of the substrate 110.

(Structure of Connector 100)

The connector 100 includes an external terminal 120, the internal terminal 1211, the plurality of internal terminals 1212, the plurality of internal terminals 1312, and an insulating member 122. The insulating member 122 of the connector 100 is substantially rectangular. The internal terminal 1211, the plurality of internal terminals 1212, and the plurality of internal terminals 1312 are held by the insulating member 122. Each of the internal terminal 1211, the internal terminals 1212, and the internal terminals 1312 corresponds to the "connection terminal" of the present disclosure.

The internal terminal 1211 and the internal terminals 1212 are arranged at intervals along the first direction of the insulating member 122. The internal terminal 1211 is arranged at one end of the arrangement.

The internal terminals 1312 are arranged at intervals along the first direction of the insulating member 122. A row of the internal terminal 1211 and the plurality of internal terminals 1212 and a row of the plurality of internal terminals 1312 are parallel to each other, and these rows are arranged at intervals in the second direction.

The external terminals 120 are formed at both ends of the insulating member 122 in the first direction, respectively. The external terminal 120 is U-shaped in plan view, and has an opening at a center. The opening is formed by an outer wall included in the external terminal 120. The respective external terminals 120 at both the ends are arranged such that respective opening sides of the U-shaped openings face each other.

(Connection Structure Between Connector 100 and Substrate 110)

The connector 100 having the above-described configuration is mounted on the substrate 110. The internal terminal 1211 overlaps the substrate-side terminal conductor 161 in plan view, and is connected to the substrate-side terminal conductor 161. The internal terminals 1212 overlap the substrate-side terminal conductors 1621, respectively, in plan view, and are connected to the substrate-side terminal conductors 1621, respectively. The internal terminals 1312 overlap the substrate-side terminal conductors 1622, respectively, in plan view, and are connected to the substrate-side terminal conductors 1622, respectively. Note that, in the present specification and the like, "the internal terminal overlaps the substrate-side terminal conductor in plan view" means that at least part or all of an arrangement region of the internal terminal overlaps an arrangement region of the substrate-side terminal conductor in plan view.

(Description of Suppression of Deterioration of Transmission Characteristics)

Figure 5A:
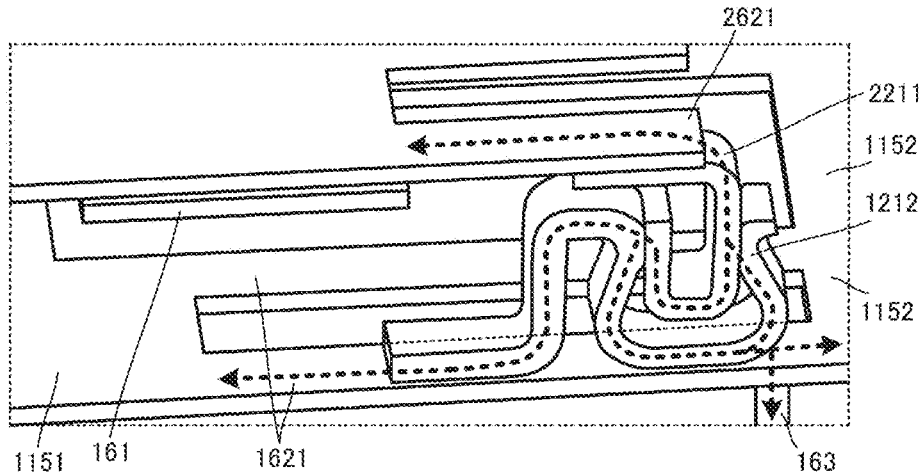
FIG. 5A is a diagram illustrating a propagation path of a high-frequency noise in a case of using a configuration of the substrate of the present embodiment.
Figure 5B:
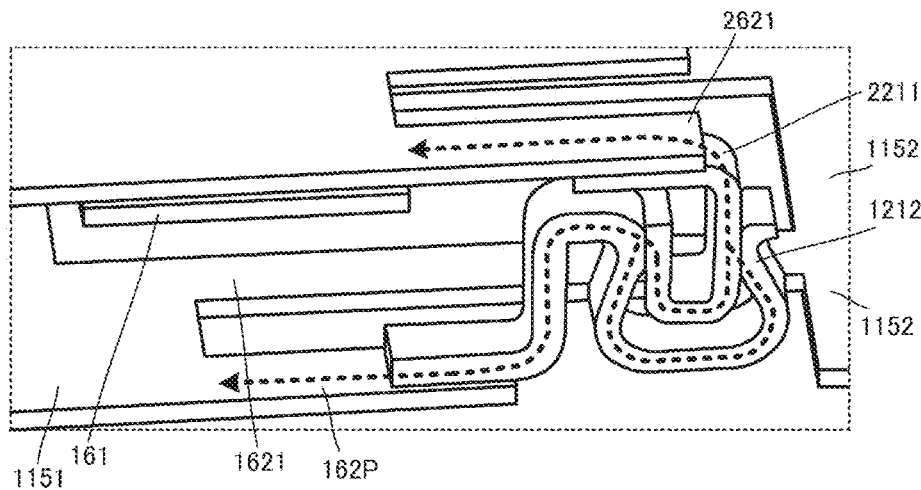
FIG. 5B is a diagram illustrating a propagation path of a high-frequency noise in a case of using a substrate to be compared.

FIG. 5A is a diagram illustrating a propagation path of a high-frequency noise in a case of using a configuration of the substrate 110 of the present embodiment, and FIG. 5B is a diagram illustrating a propagation path of a high-frequency noise in a case of using a substrate to be compared. Note that, in FIG. 5B, the substrate-side terminal conductor 1621 of the present embodiment is replaced with a substrate-side terminal conductor 162P, and the substrate-side terminal conductor 162P is connected to only one location of the ground conductor 1151.

In the above-described configuration, the internal terminal 1211 is a terminal for transmitting a high-frequency signal, and the plurality of internal terminals 1212 and the plurality of internal terminals 1312 are free terminals. A free terminal means a terminal that is not used for transmitting signals including a high-frequency signal.

In this case, the inventor found that a high-frequency signal to be transmitted to the internal terminal 1211 and the substrate-side terminal conductor 161 radiates, and a high-frequency noise (radiation noise) occurs due to the influence of the radiation. In particular, the inventor found that when the substrate-side terminal conductor 1621 adjacent to the substrate-side terminal conductor 161 is connected to the ground conductor 115, a high-frequency noise oscillated due to this shape occurs, and is received by another substrate-side terminal conductor 1621 and a substrate-side terminal conductor 1622. That is, it was found that when there is a substrate-side terminal conductor that is not used for transmitting signals including a high-frequency signal, a high-frequency noise is superimposed on the substrate-side terminal conductor.

As illustrated in FIG. 5B, when the substrate-side terminal conductor 162P, which is not used for transmitting signals including a high-frequency signal, is connected to the ground conductor 115 at only one location, a high-frequency noise adversely affects transmission characteristics of a high-frequency signal.

Figure 6:
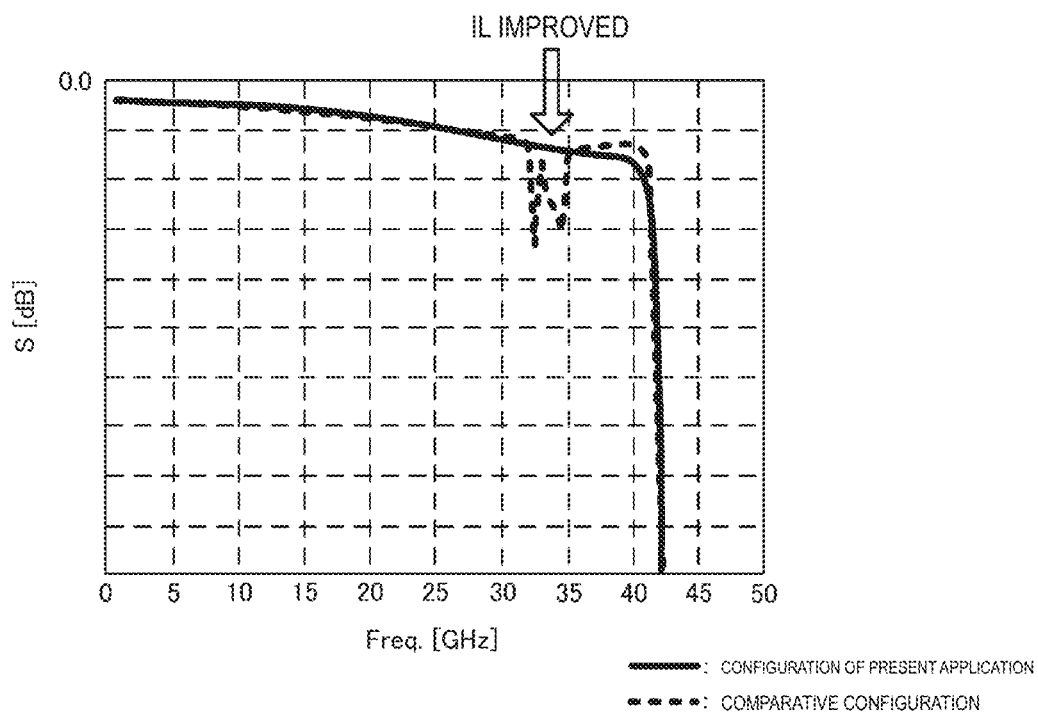
FIG. 6 is a graph showing insertion loss characteristics.

Thus, as illustrated in FIG. 5A, the inventor devised the configuration in which the substrate-side terminal conductor 1621 and the substrate-side terminal conductor 1622, which are not used for transmitting signals including a high-frequency signal, are connected to the ground conductor 1151 and the ground conductor 1152 at two locations. Thus, characteristics shown in FIG. 6 were obtained. FIG. 6 is a graph showing insertion loss characteristics. In FIG. 6, a solid line indicates a case where the configuration of the present disclosure is used, and a dotted line indicates a case where a comparative configuration is used.

As shown in FIG. 6, deterioration of an insertion loss (IL) existing from 30 GHz to 35 GHz was improved by using the configuration of the present disclosure. It is conceivable that a level of a high-frequency noise was suppressed and the insertion loss was improved by providing a plurality of propagation paths of the high-frequency noise to the ground potential. Further, as illustrated in FIG. 5A, by forming the propagation path of the high-frequency noise by the interlayer connection conductor 163, the level of the high-frequency noise is further suppressed, and the insertion loss is further improved.

As described above, by using the configuration of the present embodiment, the connector member 10 can suppress the deterioration of the transmission characteristics due to the radiation noise caused by the high-frequency signal in the configuration having a terminal for transmitting a high-frequency signal.

Note that, by configuring the connector member 20 to be fitted to the connector member 10 as follows, it is possible to further suppress the deterioration of the transmission characteristics due to the radiation noise caused by the high-frequency signal.

(Structure of Connector Member 20)

As illustrated in FIG. 3A, FIG. 3B, and FIG. 4, the connector member 20 includes the connector 200 and the substrate 210. The connector 200 is mounted on the substrate 210.

(Structure of Substrate 210)

The substrate 210 includes an insulating base material, and has a main surface 211 and a main surface 212 opposite from each other. The main surface 211 corresponds to "a main surface of a base material" of the present disclosure. A ground conductor 215, a substrate-side terminal conductor 261, a plurality of substrate-side terminal conductors 2621, and a plurality of substrate-side terminal conductors 2622 are formed on the main surface 211 of the substrate 210. The substrate-side terminal conductor 261, the plurality of substrate-side terminal conductors 2621, and the plurality of substrate-side terminal conductors 2622 are strip-shaped conductor patterns extending along the second direction of the substrate 210.

The substrate-side terminal conductor 261 and the substrate-side terminal conductors 2621 are arranged at intervals along the first direction of the substrate 210. The substrate-side terminal conductor 261 is arranged at one end of the arrangement.

The substrate-side terminal conductors 2622 are arranged at intervals along the first direction of the substrate 210. A row of the plurality of substrate-side terminal conductors 2622 is parallel to a row of the substrate-side terminal conductors 261 and the plurality of substrate-side terminal conductors 2621, and these rows are arranged at intervals in the second direction. That is, the substrate-side terminal conductors including the substrate-side terminal conductor 261, the substrate-side terminal conductors 2621, and the substrate-side terminal conductors 2622 are arranged in the multiple rows. Further, the number of the substrate-side terminal conductors 2622 is the same as the number of the substrate-side terminal conductor 261 and the substrate-side terminal conductors 2621, and in the first direction, one substrate-side terminal conductor 2622 is at the same position as the substrate-side terminal conductor 261, and the other substrate-side terminal conductors 2622 are at the same positions as the substrate-side terminal conductors 2621, respectively.

A slit 252 having a substantially rectangular shape in plan view is formed between the substrate-side terminal conductor 261 and the substrate-side terminal conductor 2621 adjacent thereto, and between the adjacent substrate-side terminal conductors 2621 in the plurality of substrate-side terminal conductors 2621. Additionally, slits 252 are also formed on both sides of the row including the substrate-side terminal conductor 261 and the plurality of substrate-side terminal conductors 2621, respectively.

The plurality of slits 252 is realized by a portion of the main surface 211 of the substrate 210 where no conductor is formed.

Further, slits 2520 are also formed on both sides of the substrate-side terminal conductor 261 in the second direction, respectively, and the substrate-side terminal conductor 261 is surrounded by the respective slits 252 on both the sides in the first direction, and the respective slits 2520 on both the sides in the second direction. The plurality of slits 2520 is realized by a portion of the main surface 211 of the substrate 210 where no conductor is formed. Thus, the substrate-side terminal conductor 261 is separated from other conductor patterns on the main surface 211 of the substrate 210.

The slit 252 having a substantially rectangular shape in plan view is formed between the adjacent substrate-side terminal conductors 2622 in the plurality of substrate-side terminal conductors 2622. Additionally, the slits 252 are also formed on both sides of the row including the plurality of substrate-side terminal conductors 2622, respectively.

The ground conductor 215 is a conductor pattern connected to the ground potential. The ground conductor 215 is constituted by a ground conductor 2151 and a ground conductor 2152. The ground conductor 215 corresponds to the "first ground conductor" of the present disclosure, the ground conductor 2151 corresponds to the "second ground conductor" of the present disclosure, and the ground conductor 2152 corresponds to the "third ground conductor" of the present disclosure.

The ground conductor 2151 is formed over substantially an entire region of the main surface 211 between all side ends of the substrate 210 and a region where the substrate-side terminal conductor 261, the plurality of substrate-side terminal conductors 2621, and the plurality of substrate-side terminal conductors 2622 are formed. The ground conductor 2152 is formed between a region where the substrate-side terminal conductor 261 and the plurality of substrate-side terminal conductors 2621 are formed and a region where the plurality of substrate-side terminal conductors 2622 is formed. The ground conductor 2152 is connected to the ground conductor 2151.

A plurality of slits 251 is formed in the ground conductor 2151. The slits 251 are U-shaped in plan view, and are respectively formed near both ends of the region in which the substrate-side terminal conductor 261, the plurality of substrate-side terminal conductors 2621, and the plurality of substrate-side terminal conductors 2622 are formed in the first direction. Further, the slits 251 are formed at substantially the same positions as a row of the substrate-side terminal conductor 261 and the plurality of substrate-side terminal conductors 2621, and a row of the plurality of substrate-side terminal conductors 2622 in the second direction. The slits 251 are arranged such that U-shaped openings face each other in the first direction.

One end of each of the substrate-side terminal conductors 2621 and the substrate-side terminal conductors 2622 is connected to the ground conductor 2151, and another end thereof is connected to the ground conductor 2152. That is, all of the plurality of substrate-side terminal conductors 2621 and the plurality of substrate-side terminal conductors 2622 are connected to the ground conductor 2151 and the ground conductor 2152, in other words, all of the plurality of substrate-side terminal conductors 2621 and the plurality of substrate-side terminal conductors 2622 are connected to the ground conductor 215 at multiple locations.

On the main surface 212 and in another layer of the substrate 210, although not illustrated, a ground conductor is formed. That is, a ground conductor (corresponding to the "fourth ground conductor" of the disclosure) is formed at a position different from the ground conductor 215 in a thickness direction of the substrate 210.

The substrate 210 includes a plurality of interlayer connection conductors 263, an interlayer connection conductor 264, a plurality of interlayer connection conductors 265, and a plurality of interlayer connection conductors 266. The plurality of interlayer connection conductors 263, the plurality of interlayer connection conductors 265, and the plurality of interlayer connection conductors 266 correspond to the "ground interlayer connection conductors" of the present disclosure. The interlayer connection conductor 264 overlaps the substrate-side terminal conductor 261 in plan view. The interlayer connection conductor 264 is connected to the substrate-side terminal conductor 261, and is connected to a wiring conductor (not illustrated) in the other layer of the substrate 210. The plurality of interlayer connection conductors 263 overlaps the plurality of substrate-side terminal conductors 2621 and the plurality of substrate-side terminal conductors 2622 in plan view. The plurality of interlayer connection conductors 263 connects the plurality of substrate-side terminal conductors 2621 and the plurality of substrate-side terminal conductors 2622 to a ground conductor of the main surface 212 or a ground conductor in a layer other than the main surface 211 of the substrate 210. The plurality of interlayer connection conductors 265 overlaps the ground conductor 2152 in plan view. The plurality of interlayer connection conductors 265 connects the ground conductor 2152 to the ground conductor of the main surface 212 or the ground conductor in the layer other than the main surface 211 of the substrate 210. The plurality of interlayer connection conductors 266 overlaps the ground conductor 2151 in plan view. The plurality of interlayer connection conductors 266 connects the ground conductor 2151 to the ground conductor of the main surface 212 or the ground conductor in the layer other than the main surface 211 of the substrate 210.

(Structure of Connector 200)

The connector 200 includes an external terminal 220, the internal terminal 2211, the plurality of internal terminals 2212, the plurality of internal terminals 2312, and an insulating member 222. The insulating member 222 of the connector 200 is substantially rectangular. The internal terminal 2211, the plurality of internal terminals 2212, and the plurality of internal terminals 2312 are held by the insulating member 222. Each of the internal terminal 2211, the internal terminals 2212, and the internal terminals 2312 corresponds to the "connection terminal" of the disclosure.

The internal terminal 2211 and the internal terminals 2212 are arranged at intervals along the first direction of the insulating member 222. The internal terminal 2211 is arranged at one end of the arrangement.

The internal terminals 2312 are arranged at intervals along the first direction of the insulating member 222. A row of the internal terminal 2211 and the plurality of internal terminals 2212 and a row of the plurality of internal terminals 2312 are parallel to each other, and these rows are arranged at intervals in the second direction.

The external terminals 220 are formed at both ends of the insulating member 222 in the first direction, respectively. The external terminals 220 are substantially rectangular in plan view, and has a convex shape having a predetermined height.

(Connection Structure Between Connector 200 and Substrate 210)

The connector 200 having the above-described configuration is mounted on the substrate 210. The internal terminal 2211 overlaps the substrate-side terminal conductor 261 in plan view, and is connected to the substrate-side terminal conductor 261. The internal terminals 2212 overlap the substrate-side terminal conductors 2621, respectively, in plan view, and are connected to the substrate-side terminal conductors 2621, respectively. The internal terminals 2312 overlap the substrate-side terminal conductors 2622, respectively, in plan view, and are connected to the substrate-side terminal conductors 2622, respectively.

By configuring the connector member 20 as described above, similarly to the connector member 10, deterioration of transmission characteristics due to a radiation noise caused by a high-frequency signal can be suppressed in a configuration having a terminal for transmitting a high-frequency signal.

In addition, by using the connector member 10 and the connector member 20 in combination, it is possible to further suppress an influence of a radiation noise caused by a high-frequency signal. Then, it is possible to further suppress the deterioration of the transmission characteristics.

In addition, in the above-described configuration, when the connector member 10 and the connector member 20 are fitted to each other, the external terminal 120 of the connector 100 and the slit 251 of the substrate 210 overlap each other. Accordingly, capacitive coupling is suppressed between the external terminal 120 and the ground conductor 2151. Capacitive coupling occurs when the slit 251 of the substrate 210 is absent and the ground conductor 2151 is present instead.

Similarly, when the connector member 10 and the connector member 20 are fitted to each other, the external terminal 220 of the connector 200 and the slit 151 of the substrate 110 overlap each other. Accordingly, capacitive coupling is suppressed between the external terminal 220 and the ground conductor 1151. Capacitive coupling occurs when the slit 151 of the substrate 110 is absent and the ground conductor 1151 is present instead.

Thus, transmission characteristics when a high-frequency signal is transmitted by a connector unit are further improved.

Second Embodiment

Figure 7:
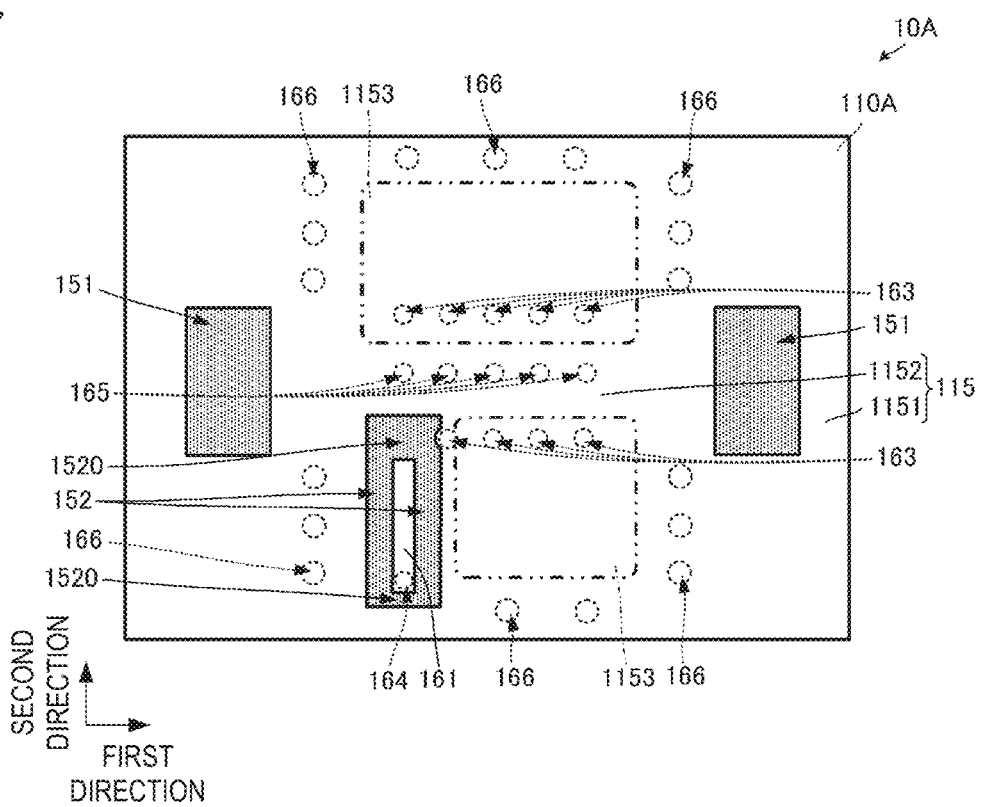
FIG. 7 is a plan view of a substrate of a connector member according to the second embodiment.

A connector member according to a second embodiment of the present disclosure will be described with reference to the accompanying drawings. FIG. 7 is a plan view of the substrate 110A of the connector member 10A according to the second embodiment. A connector in the connector member 10A is similar to the connector 100 according to the first embodiment, and illustration and description thereof will be omitted.

As illustrated in FIG. 7, the connector member 10A differs from the connector member 10 according to the first embodiment in structure of a substrate-side connection terminal connected to connection terminals (the plurality of internal terminals 1212 and the plurality of internal terminals 1312 in FIG. 1A) that are not used for transmitting signals including a high-frequency signal. Other configurations of the connector member 10A are similar to those of the connector member 10, and description of similar portions will be omitted.

A ground conductor 1153 is formed in a region (region surrounded by a two dot-chain line in FIG. 7) on the substrate 110A where the connection terminals that are not used for transmitting signals including a high-frequency signal are formed. The ground conductor 1153 is part of the ground conductor 115, and is a rectangular conductor pattern formed so as to fill a space between the ground conductor 1151 and the ground conductor 1152.

Even with such a configuration, the connector member 10A can suppress deterioration of transmission characteristics due to a radiation noise caused by a high-frequency signal in the configuration having a terminal for transmitting a high-frequency signal.

Note that, although not illustrated, for the connector member 20 as well, an aspect is applicable in which the connector member 10 is modified into the connector member 10A.

Third Embodiment

Figure 8:
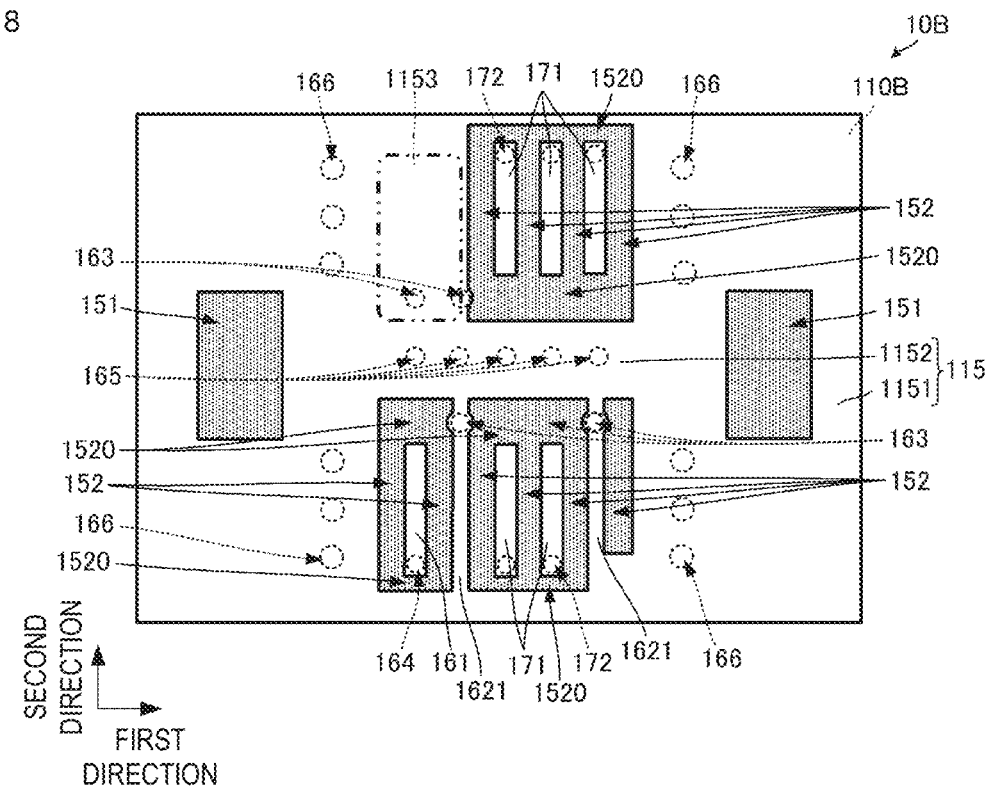
FIG. 8 is a plan view of a substrate of a connector member according to a third embodiment.

A connector member according to a third embodiment of the present disclosure will be described with reference to the accompanying drawings. FIG. 8 is a plan view of the substrate 110B of the connector member 10B according to the third embodiment. A connector in the connector member 10B is similar to the connector 100 according to the first embodiment, and illustration and description thereof will be omitted.

As illustrated in FIG. 8, the connector member 10B differs from the connector member 10 according to the first embodiment or the connector member 10A according to the second embodiment in structure of a substrate-side connection terminal connected to a connection terminal used for transmitting signals different from a high-frequency signal (connection terminal for other signals). Other configurations of the connector member 10B are similar to those of the connector member 10 or the connector member 10A, and description of similar portions will be omitted.

As illustrated in FIG. 8, the connector member 10B includes a connection terminal for other signals. In the example of FIG. 8, referring to FIG. 1A, two of the internal terminals 1212 and three of the internal terminals 1312 correspond to the connection terminals for other signals.

Substrate-side terminal conductors 171 are formed on portions overlapping the connection terminals for other signals of the connector 100 of the substrate 110B, respectively. The plurality of substrate-side terminal conductors 171 is separated from the ground conductor 115, by the slit 152 and the slit 1520.

Note that, the structure of the substrate 110 illustrated in the first embodiment or the structure of the substrate 110A illustrated in the second embodiment described above is applied to respective portions overlapping the connection terminals which are not used for transmitting signals including a high-frequency signal on the substrate 110B. That is, even in the structure having the connection terminal for other signals, a substrate-side terminal conductor connected to the connection terminal not used for transmitting signals including a high-frequency signal is connected to a ground conductor at multiple locations, or is formed as part of the ground conductor.

With this configuration, even in the structure having the connection terminal for another signals, in a configuration having a terminal for transmitting a high-frequency signal, it is possible to suppress deterioration of transmission characteristics due to a radiation noise caused by the high-frequency signal.

Note that, the respective configurations of the above-described embodiments can be appropriately combined, and effects corresponding to the combination can be obtained.

In addition, in each of the above-described embodiments, all the substrate-side terminal conductors connected to the connection terminals that are not used for transmitting signals including a high-frequency signal are connected to the ground conductor 115 at two locations, or are formed as part of the ground conductor 115. However, it is sufficient that at least two substrate-side terminal conductors including a substrate-side terminal conductor close to a substrate-side terminal conductor connected to a connection terminal for transmitting a high-frequency signal are connected to the ground conductor 115 at two locations, or formed as part of the ground conductor 115. However, it is preferable that as many connection terminals as possible among the connection terminals that are not used for transmitting signals including a high-frequency signal be connected to the ground conductor 115 at two locations, or formed as part of the ground conductor 115.

What is claimed is:

1. A connector member, comprising:
a connector including an insulating member, and a plurality of connection terminals arranged on and held by the insulating member; and
a substrate including an insulating base material, a plurality of substrate-side terminal conductors formed on a surface of the base material, and a first ground conductor connected to ground potential, wherein
the first ground conductor includes a second ground conductor having a shape surrounding the plurality of substrate-side terminal conductors,
the plurality of connection terminals is mounted on the plurality of substrate-side terminal conductors, and
at least two of the substrate-side terminal conductors, on which are mounted a group of the connection terminals not used for transmitting signals including a high-frequency signal, are connected to the first ground conductor at multiple locations.

2. The connector member according to claim 1, wherein
the plurality of connection terminals and the plurality of substrate-side terminal conductors are arranged in multiple rows along a first direction,
the first ground conductor, in plan view of the substrate, includes the second ground conductor having the shape surrounding the plurality of substrate-side terminal conductors and a third ground conductor formed between the multiple rows, and
the substrate-side terminal conductors, on which the group of the connection terminals not used for transmitting the signals are mounted, are connected to the second ground conductor and the third ground conductor.

3. The connector member according to claim 1, wherein
the substrate includes a fourth ground conductor formed at a position different from the first ground conductor in a thickness direction of the substrate,
the substrate-side terminal conductors, on which the group of the connection terminals not used for transmitting the signals are mounted, are connected to the fourth ground conductor with a ground interlayer connection conductor formed in the substrate interposed between the substrate-side terminal conductors and the fourth ground conductor, and the ground interlayer connection conductor overlaps, in plan view of the substrate, the substrate-side terminal conductors on which the group of the connection terminals not used for transmitting the signals are mounted.

4. The connector member according to claim 1, wherein all of the substrate-side terminal conductors on which, in the plurality of connection terminals, the group of the connection terminals not used for transmitting the signals are mounted, are connected to the first ground conductor at multiple locations.

5. A connector member, comprising:
a connector including an insulating member, and a plurality of connection terminals arranged on and held by the insulating member; and
a substrate including an insulating base material, a plurality of substrate-side terminal conductors formed on a surface of the base material, a first ground conductor connected to ground potential, a second ground conductor, and a third ground conductor, wherein
the plurality of connection terminals is mounted on the plurality of substrate-side terminal conductors,
the substrate-side terminal conductor, on which is mounted a connection terminal, of the plurality of connection terminals, that is not used for transmitting signals including a high-frequency signal, is configured by part of the first ground conductor, and
the part of the first ground conductor at least partially fills a space between the second ground conductor and the third ground conductor.

6. The connector member according to claim 1, wherein a substrate-side terminal conductor, adjacent to a substrate-side terminal conductor on which is mounted a connection terminal, of the plurality of connection terminals, used for transmitting the high-frequency signal, is connected to the first ground conductor at multiple locations.

7. A connector set, comprising:
a first connector member and a second connector member each having a configuration of the connector member according to claim 1, wherein
a connector of the first connector member and a connector of the second connector member are fitted to each other.

8. The connector member according to claim 2, wherein the substrate includes a fourth ground conductor formed at a position different from the first ground conductor in a thickness direction of the substrate,
the substrate-side terminal conductors, on which the group of the connection terminals not used for transmitting the signals are mounted, are connected to the fourth ground conductor with a ground interlayer connection conductor formed in the substrate interposed between the substrate-side terminal conductors and the fourth ground conductor, and
the ground interlayer connection conductor overlaps, in plan view of the substrate, the substrate-side terminal conductors on which the group of the connection terminals not used for transmitting the signals are mounted.

9. The connector member according to claim 2, wherein all of the substrate-side terminal conductors on which, in the plurality of connection terminals, the group of the connection terminals not used for transmitting the signals are mounted, are connected to the first ground conductor at multiple locations.

10. The connector member according to claim 3, wherein all of the substrate-side terminal conductors on which, in the plurality of connection terminals, the group of the connection terminals not used for transmitting the signals are mounted, are connected to the first ground conductor at multiple locations.

11. The connector member according to claim 8, wherein all of the substrate-side terminal conductors on which, in the plurality of connection terminals, the group of the connection terminals not used for transmitting the signals are mounted, are connected to the first ground conductor at multiple locations.

12. The connector member according to claim 2, wherein a substrate-side terminal conductor, adjacent to a substrate-side terminal conductor on which is mounted a connection terminal, of the plurality of connection terminals, used for transmitting the high-frequency signal, is connected to the first ground conductor at multiple locations.

13. The connector member according to claim 3, wherein a substrate-side terminal conductor, adjacent to a substrate-side terminal conductor on which is mounted a connection terminal, of the plurality of connection terminals, used for transmitting the high-frequency signal, is connected to the first ground conductor at multiple locations.

14. The connector member according to claim 4, wherein a substrate-side terminal conductor, adjacent to a substrate-side terminal conductor on which is mounted a connection terminal, of the plurality of connection terminals, used for transmitting the high-frequency signal, is connected to the first ground conductor at multiple locations.

15. The connector member according to claim 5, wherein a substrate-side terminal conductor, adjacent to a substrate-side terminal conductor on which is mounted a connection terminal, of the plurality of connection terminals, used for transmitting the high-frequency signal, is connected to the first ground conductor at multiple locations.

16. A connector set, comprising:
a first connector member and a second connector member each having a configuration of the connector member according to claim 2, wherein
a connector of the first connector member and a connector of the second connector member are fitted to each other.

17. A connector set, comprising:
a first connector member and a second connector member each having a configuration of the connector member according to claim 3, wherein
a connector of the first connector member and a connector of the second connector member are fitted to each other.

18. A connector set, comprising:
a first connector member and a second connector member each having a configuration of the connector member according to claim 4, wherein
a connector of the first connector member and a connector of the second connector member are fitted to each other.

19. A connector set, comprising:
a first connector member and a second connector member each having a configuration of the connector member according to claim 5, wherein
a connector of the first connector member and a connector of the second connector member are fitted to each other.

20. A connector set, comprising:
a first connector member and a second connector member each having a configuration of the connector member according to claim 6, wherein
a connector of the first connector member and a connector of the second connector member are fitted to each other.

* * * * *